United States Patent
Asami

[11] Patent Number: 5,821,165
[45] Date of Patent: Oct. 13, 1998

[54] METHOD OF FABRICATING SEMICONDUCTOR DEVICES

[75] Inventor: Teruo Asami, Tateyama, Japan

[73] Assignee: Nippon Steel Semiconductor Corporation, Tateyama, Japan

[21] Appl. No.: 654,679

[22] Filed: May 29, 1996

[30] Foreign Application Priority Data

Jun. 9, 1995 [JP] Japan ................................. 7-143730

[51] Int. Cl.⁶ ............................................. H01L 21/441
[52] U.S. Cl. .................... 438/634; 438/668; 438/635; 438/647; 438/657
[58] Field of Search ................................. 437/186, 191, 437/238, 968, 985; 156/643.1; 438/634, 635, 647, 657, 668, 669, 671, 723

[56] References Cited

U.S. PATENT DOCUMENTS 4,214,946  7/1980  Forget et al. ............................ 437/981
4,613,402  9/1986  Losee et al. .......................... 156/643.1

FOREIGN PATENT DOCUMENTS 52 130567  11/1977  Japan .
55 8093    1/1980   Japan .
58 95867   6/1983   Japan .
2 121336   5/1990   Japan .
07-86584   3/1995   Japan .

*Primary Examiner*—Caridad Everhart
*Attorney, Agent, or Firm*—Oblon, Spivak, McClelland, Maier & Neustadt, P.C.

[57] ABSTRACT

The present invention provides a method of fabrication for semiconductor devices which enables a photolithography technique in a fabrication process to have a maximal effect on the transistor characteristics. Polysilicon film 16 and silicon nitride film 17 are formed to active transistor 11 and field shield isolation transistor 12, with isotropic etching of silicon nitride film 17 carried out using a resist pattern 20 which was patterned within the minimum processing width as the mask. Then, using the pattern of silicon nitride film 17 as a mask, thermal oxidation of polysilicon film 16 is carried out. Next, after eliminating silicon nitride film 17, anisotropic etching of polysilicon film 16 is carried out using silicon oxide film 21 as a mask, silicon oxide film 21 being formed by thermal oxidation of polysilicon film 16. In this way, a contact pad 22 formed of polysilicon film 16 is completed. As a result, the dimensions between polysilicon pads 22,22 is smaller than the minimum processing width for a photolithography technique by an amount equivalent to the amount of side etching of silicon nitride film 17 and the amount of oxidation in the horizontal direction of polysilicon film 16.

18 Claims, 2 Drawing Sheets

METHOD OF FABRICATING SEMICONDUCTOR DEVICES

BACKGROUND OF THE INVENTION

1. Field of the Invention

The present invention relates to a method of fabricating semiconductor devices which employs a self-align contact technique using polysilicon, an example of such semiconductor devices being one which has a field shield isolation transistor as a device isolation means.

2. Description of the Related Art

Field shield device isolation methods have gained attention in recent years as device isolation methods for integrated circuits. In the case of a field shield device isolation method employed in CMOS, a field shield gate is formed between active transistors, and electric potentials are impressed on the field shield gate respectively corresponding to the P channel and N channel sides (for example, the electric source potential is impressed on the P channel side and the ground potential is impressed on the N channel side).

As a result, the electrical isolation of active transistors is carried out by maintaining an OFF-state of the field shield isolation transistor.

In other words, in a field shield device isolation structure, the field shield gate and the diffusion layers of the active transistors on either side of the field shield gate form a single MOS structure (hereinafter, this MOS structure will be referred to as a field shield isolation transistor). In a semiconductor device having this field shield isolation transistor, it is necessary to employ a self-align contact method using a pad made of polysilicon or the like for the contact with the diffusion layer. This is so that a short between the electrode in the contact hole and the field shield gate can be avoided.

FIGS. 2A through 2D show the order of the steps for fabricating a polysilicon pad for self-align contact in the conventional fabrication method. First, as shown in FIG. 2A, an active transistor 1 and a field shield isolation transistor 2 are formed. An insulator film 3 is formed covering transistors 1 and 2, after which a hole is opened in insulator film 3 using anisotropic etching, exposing a portion of the surfaces of diffusion layers 4,4. Next, side walls 5,5 of gate of active transistor 1 are formed by oxide film. Next, as shown in FIG. 2B, a polysilicon film 6 is formed on top of insulator film 3 and side walls 5,5, after which resist patterns 7,7 are formed on polysilicon film 6, as shown in FIG. 2C. Then, as shown in FIG. 2D, polysilicon layer 6 is etched using the resist pattern 7 as a mask. When resist pattern 7 is eliminated, the polysilicon films 9,9 remaining form the contact pads with diffusion layers 4, 4.

In the above described fabrication process for a polysilicon pad for self-align contact, in order to avoid exposing the substrate (diffusion layer 4) after polysilicon pad 9 is formed, it is necessary to carry out etching of polysilicon film 6 above gate electrode 8 so that the edge of polysilicon pad 9 is positioned above gate electrode 8. For this reason, as shown in FIG. 2D, the length Lg' of gate electrode 8 must be greater than or equal to the sum of the processing width D' of polysilicon pad 9 and alignment margin M (2M for both sides) of resist pattern 7 with respect to gate electrode 8 (In other words, Lg'×D'+2M").

In the case where attempting to scale down the MOS transistor, even if the minimum processing width Lmin' (space between resist patterns 7,7) for a photolithography technique is employed for the processing of polysilicon pad 9, the gate length Lg' of active transistor 1 inevitably exceeds the minimum processing width. Accordingly, in the case when a contact pad fabrication method such as described above is employed, the transistor characteristics must be sacrificed because of the problems in processing, without being able to obtain maximal effects from photolithography technique on the transistor characteristics. Conversely, when an attempt is made to scale the gate length down to the minimum processing width for the photolithography technique, it becomes impossible to accurately form the polysilicon pad.

SUMMARY OF THE INVENTION

The present invention was conceived to resolve the aforementioned problems, and has as its objective the provision of a method of fabrication for semiconductor devices which enables a photolithography technique to have the maximal effect on transistor characteristics in the fabrication process.

In order to achieve the aforementioned objective, the present invention's method of fabrication for semiconductor devices is characterized in the provision of the steps of:

(a) forming a MOS transistor on top of a semiconductor substrate, forming an insulator film covering the MOS transistor, and exposing a portion of the surface of the diffusion layer forming the MOS transistor by opening a hole in one part of the insulator film;

(b) sequentially forming a polysilicon film and a silicon nitride film on the insulator film;

(c) patterning the silicon nitride film within the minimum processing width in the fabrication process so as to leave the silicon nitride pattern above the gate electrode of the MOS transistor;

(d) carrying out thermal oxidation of the polysilicon film using the silicon nitride film pattern as a mask;

(e) eliminating the silicon nitride film pattern; and (f) etching the polysilicon film using the silicon oxide film formed by thermal oxidation of the polysilicon film in step (d) as a mask.

In the above step (a), an active transistor and a field shield isolation transistor may be formed on top of a semiconductor substrate, with an insulator film formed to cover these. Then, a portion of the surface of the diffusion layer common to the active transistor and the field shield isolation transistor may be exposed by opening a hole in a portion of the insulator film.

Further, in step (a) above, an active transistor and a field oxide film may be formed on top of a semiconductor substrate, and an insulator film formed to cover these. Then a portion of the surface of the diffusion layer of the active transistor may be exposed by opening a hole in a portion of the insulator film.

When patterning the silicon nitride film in step (c) above, it is preferable to carry out isotropic etching of the silicon nitride film. Wet etching using hot phosphoric acid solution may be used as the method for this isotropic etching of the silicon nitride film. Further, reactive ion etching using Cl2/SF6/He as the etching gas may be used as the method for polysilicon film etching in step (f) above.

In the present invention's method of fabrication for semiconductor devices, once step (b) is completed, the polysilicon film is formed so that the exposed portion of the diffusion layer surface is buried, and a silicon nitride film is formed above the polysilicon film. Further, by patterning the silicon nitride film in step (c), the pattern of the silicon nitride film remaining above the gate electrode of the MOS transistor is formed. Next, in step (d), oxidation of the polysilicon film in which this the silicon nitride film pattern serves as a mask is carried out. In this case, the form of oxidation is so-called local oxidation, wherein the oxidation of the polysilicon film proceeds horizontally so as to penetrate the underside of the silicon nitride film. As a result, the width of the space between adjacent oxide films becomes smaller than the width of the silicon nitride film patterned beforehand by the portion of oxidation of the polysilicon film in the horizontal direction. Therefore, when the polysilicon film is etched using the oxide film layer as a mask in step (f), the interval of space between adjacent polysilicon films, i.e., the width of the space between polysilicon pads, becomes smaller than the minimum processing width employed when carrying out patterning of the silicon nitride film.

The present invention can be suitably employed for a semiconductor device having a field oxide film or field shield isolation transistor for electrical isolation of active transistors. After a portion of the surface of the diffusion layer common to the active transistor and the field shield isolation transistor, or the diffusion layer of the active transistor, has been exposed, the effects described above can be achieved.

Further, by carrying out isotropic etching of the silicon nitride film when patterning the silicon nitride film in step (c), side etching is added to the silicon nitride film under the resist. As a result, the width of the silicon nitride film becomes smaller with respect to the minimum processing width for a photolithography technique, i.e., the resist processing width.

Thus, in the end, the final interval obtained between two adjacent polysilicon pads is smaller than the minimum processing width by a photolithography technique by the amount of the side etching of the silicon nitride film and further by the amount of oxidation of the polysilicon film in the horizontal direction.

DETAILED DESCRIPTION OF THE PREFERRED EMBODIMENTS

The present invention will now be explained with reference being given to the figures.

The method of fabrication for semiconductor devices in the present embodiment involves an example employing the present invention in a CMOS fabrication process in which the minimum processing width of the photolithography technique is 0.35 um. FIGS. 1A through 1E show the order of the steps to form a polysilicon pad for self-align contact in this method.

The N channel transistor side of the semiconductor device is shown in the figure, but the structure of the P channel transistor side is completely identical except that the conductivity of the diffusion layer is a P type conductivity.

Figure 1A:
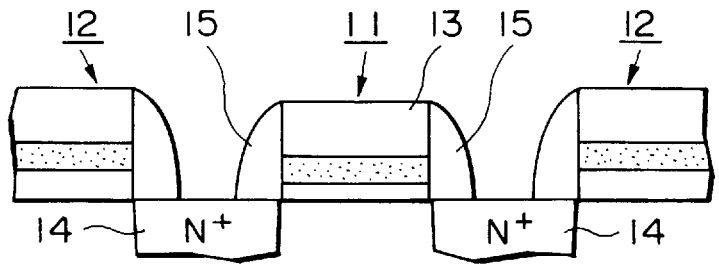
FIGS. 1A through 1E are cross-sectional views showing the present invention's embodiment of a method of fabrication for semiconductor devices and, in particular, showing the order of the steps for forming a polysilicon pad for self-align contact.

First, as shown in FIG. 1A, active transistor 11 and field shield isolation transistors 12,12 are formed. An insulator film 13 is formed covering these. Then, a portion of the surfaces of diffusion layers 14,14 are exposed by opening a hole in insulator film 13 using anisotropic etching.

Figure 1B:
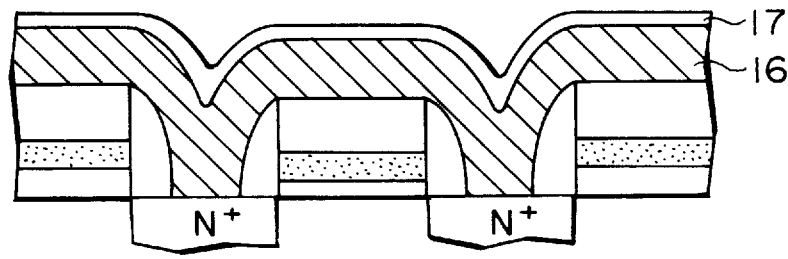

Next, oxide film walls 15,15 on the gate side of active transistor 11 are formed. Then, as shown in FIG. 1B, 100 nm thick polysilicon film 16 which will form the contact pad is formed using chemical vapor deposition (CVD) technique. Then, 10 nm thick silicon nitride film 17 is formed using CVD.

Figure 1C:
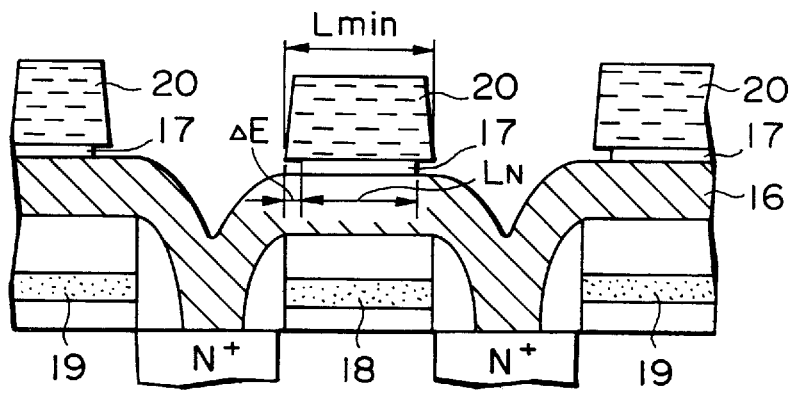

Next, as shown in FIG. 1C, resist patterns 20,20,20 are formed to the areas above the gate electrode 18 of active transistor 11 and field shield gates 19,19 of field shield isolation transistor 12 which will not form the contact pad. In this photolithography process, processing is carried out so that the resist width becomes the minimum processing width for this process (Lmin, 0.35 um).

Next, using resist pattern 20 as a mask, wet etching using hot phosphoric acid solution is carried out to silicon nitride film 17. Additionally, a method wherein the etching selective ratio with respect to polysilicon film 16 is large and isotropic etching can be carried out may be employed as this etching method. After etching, resist pattern 20 is eliminated.

Figure 1D:
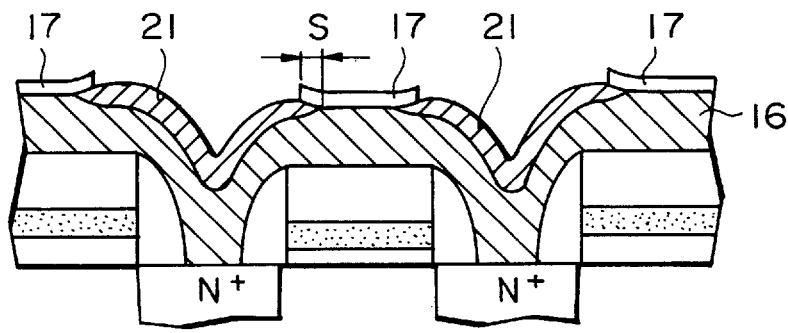

Next, as shown in FIG. 1D, using the pattern of silicon nitride film 17 as a mask, polysilicon film 16 is oxidized at 850° C., under H2/O2 for 20 minutes.

As a result, only the area in which silicon nitride film 17 is not present and polysilicon film 16 is exposed is oxidized, with local oxidation carried out to form 30 nm thick silicon oxide films 21,21. Then, silicon nitride film 17 which was employed as the mask during oxidation is eliminated with hot phosphoric acid or the like.

Figure 1E:
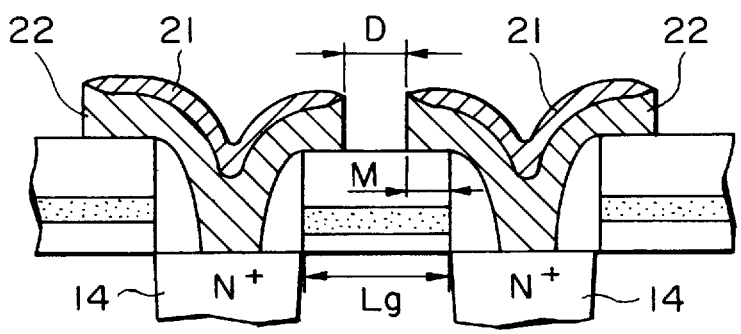
Figure 2A:
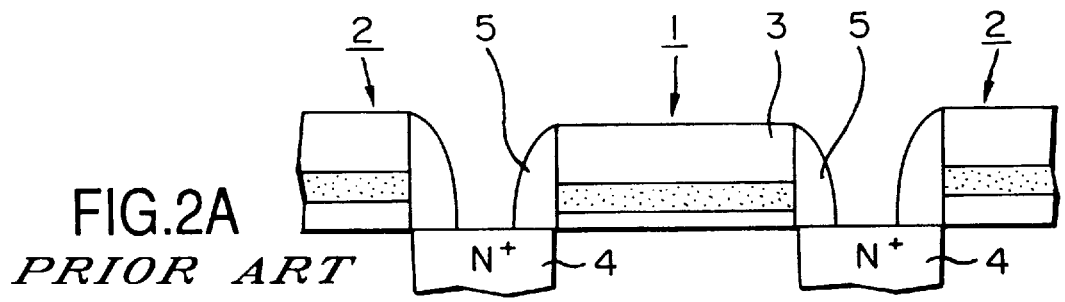
FIGS. 2A through 2D show the conventional method of fabrication for semiconductor devices and, in particular, show an example of the order of the steps for forming a polysilicon pad for self-align contact.
Figure 2B:
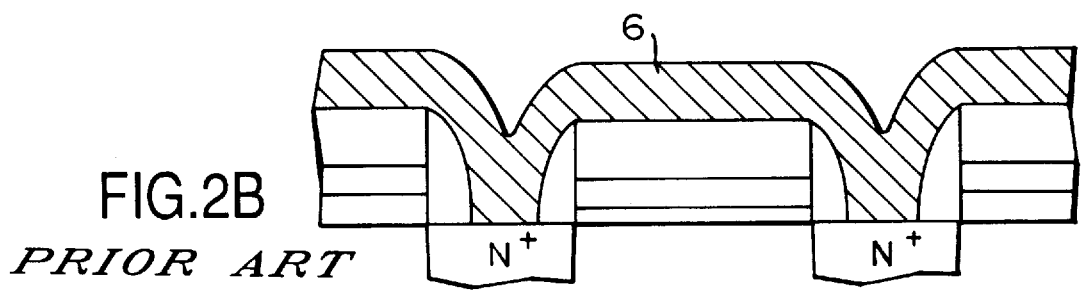
Figure 2C:
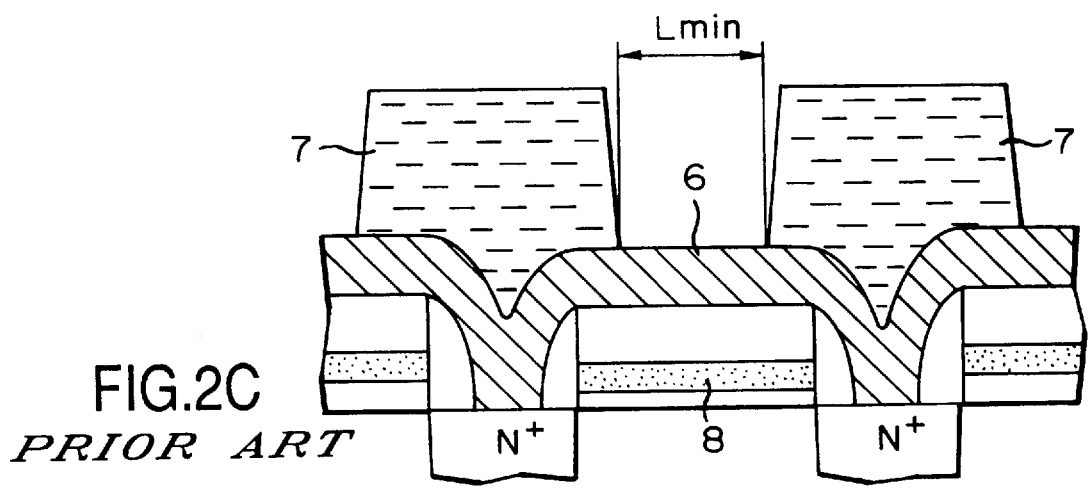
Figure 2D:
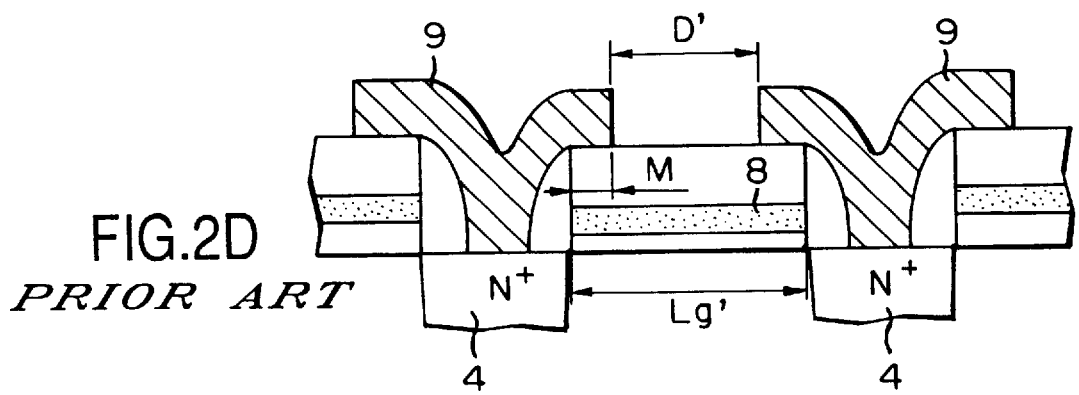

Next, as shown in FIG. 1E, using silicon oxide film 21 as a mask, polysilicon film 16 is etched using reactive ion etching employing Cl2/SF6/He as the etching gas at a pressure of 250 mTorr and an RF power of 250W. As this etching method, a method may be employed in which the etching selective ratio is large with respect to silicon oxide film 21 and anisotropic etching can be carried out. Via the above steps, a contact pad 22 of polysilicon for N+ diffusion layer 14 can be formed.

By employing both an etching method for silicon nitride film 17 and a method for forming a mask used in the etching of polysilicon film 16 in this embodiment's method of fabrication, the length Lg of the gate of active transistor 11 can be made shorter than the minimum processing widths.

In other words, as shown in FIG. 1C, by carrying out isotropic etching when etching silicon nitride film 17, side etching is added when silicon nitride film 17 under resist pattern 20 is etched. For example, in the case of the present embodiment, the amount of side etching ΔE is about 0.05 um.

Accordingly, the width LN of silicon nitride film 17 become about 0.05×2=0.1 um smaller than the minimum processing width Lmin (resist processing width).

Further, when forming silicon oxide film 21 which becomes the mask when etching polysilicon film 16, the oxidation of polysilicon film 16 proceeds in the horizontal direction so as to penetrate the underside of silicon nitride film 17. As a result, the dimension D between adjacent silicon oxide films 21,21 becomes smaller by the portion of the oxidation in the horizontal direction of polysilicon film 16 as compared to the width LN of the silicon nitride film 17 which was previously patterned. For example, in this embodiment, given the thickness of the oxide film to be formed, the portion of oxidation ΔS in the horizontal direction of polysilicon film 16 is about 0.015 um. Accordingly, the dimension D between adjacent silicon oxide films 21,21 is 0.015×2=0.03 um smaller than the width LN of silicon nitride film 17.

Therefore, the dimension D between silicon oxide films 21,21 after completion of the oxidation process is 0.13 um, i.e., the sum of 0.1 um (ΔE×2) for the portion of the side etching of silicon nitride film 17 and 0.03 um (ΔS×2) of the portion of the oxidation in the horizontal direction of polysilicon film 16. In other words, the dimension D between silicon oxide films 21,21 is smaller than the minimum processing width Lmin. Accordingly, when anisotropic etching of polysilicon film 16 is carried out using this as a mask, then a polysilicon pad 22 for self-align contact having a pad interval D which is sufficiently smaller than the minimum processing width Lmin can be formed.

Unlike conventional fabrication methods in which the actual gate length exceeded the minimum processing width, in the present invention, it is possible to make the gate length Lg equivalent to the minimum processing width, even with the addition of alignment margin 2M to pad interval D when employing a minimum processing width for the polysilicon pad. Further, in order to set a sufficient alignment margin 2M, polysilicon pad 22 can be formed into an accurate shape using a general photolithography technique. In other words, in the fabrication method of this embodiment, the photolithography technique can have maximal effects on the transistor characteristics. Thus, a semiconductor having excellent characteristics as compared to conventional methods can be fabricated.

Additionally, in this embodiment, wet etching with hot phosphoric acid was employed as the means for etching silicon nitride film 17. However, the present invention is not limited thereto, but rather another method may be employed provided it can be used with isotropic etching. Further, this embodiment is not limited with regard to the etching of the polysilicon film. Rather, provided that anisotropic etching is possible, then other methods or conditions are possible. Fabrication processes in which the present invention can be suitably employed are, of course, not limited to the 0.35 um process in this embodiment.

Further, the dimensions and film thickness of various films may be changed appropriately, to suit the fabrication process employed.

Moreover, the present embodiment shows the order of only the steps for forming the polysilicon pad for self-align contact, with other steps being completely optional. Accordingly, the present invention can be suitably employed in methods of formulation for memory, logic, microcomputer LSI and other various semiconductor devices. Furthermore, the present embodiment employed an example wherein a polysilicon pad 22 was formed to a diffusion layer 14 common to an active transistor 11 and a field shield isolation transistor 12. However, structures in the present invention can be suitably employed are not limited thereto, but, for example, may include a structure wherein a field oxide film is formed to the side of an active transistor in place of the field shield isolation transistor of the present invention. The present invention can also be suitably employed in a semiconductor device which does not have a field shield isolation structure.

What is claimed:

1. A method of fabrication of semiconductor devices, comprising the steps of:
    (a) forming a MOS transistor on top of a semiconductor substrate;
    (a-1) forming an insulator film to cover the MOS transistor, and exposing a portion of the surface of the diffusion layer which forms the MOS transistor by opening a hole in one part of the insulator film;
    (b) sequentially forming a polysilicon film and a silicon nitride film on the insulator film;
    (c) patterning the silicon nitride film by a fabrication process which leaves the silicon nitride pattern above the gate electrode of the MOS transistor within the minimum processing width;
    (d) carrying out thermal oxidation of the polysilicon film using the silicon nitride film pattern as a mask;
    (e) removing the silicon nitride film pattern; and
    (f) etching the polysilicon film using the silicon oxide film formed by thermal oxidation of the polysilicon film in step (d) as a mask.

2. A method of fabrication of semiconductor devices according to claim 1, wherein in steps (a) and (b), an active transistor and a field shield insulator transistor adjacent thereto are formed on a semiconductor substrate, an insulator film is formed to cover these components, and a portion of the surface of the diffusion layer common to the active transistor and the field shield insulator transistor is exposed by opening a hole in a portion of the insulator film.

3. A method of fabrication of semiconductor devices according to claim 1, wherein in steps (a) and (a-1), an active transistor and a field oxide film are formed on the semiconductor substrate, an insulator film is formed cover these components, and a portion of the surface of the diffusion layer of the active transistor is exposed by opening a portion of the insulator film.

4. A method of fabrication of semiconductor devices according to claim 1, wherein isotropic etching is carried out on silicon nitride film when patterning the silicon nitride film in step (c).

5. A method of fabrication of semiconductor devices according to claim 2, wherein isotropic etching is carried out on silicon nitride film when patterning the silicon nitride film in step (c).

6. A method of fabrication of semiconductor devices according to claim 3, wherein isotropic etching is carried out on silicon nitride film when patterning the silicon nitride film in step (c).

7. A method of fabrication of semiconductor devices according to claim 4, wherein wet etching employing hot phosphoric acid solution is carried out for the isotropic etching of the silicon nitride film.

8. A method of fabrication of semiconductor devices according to claim 5, wherein wet etching employing hot phosphoric acid solution is carried out for the isotropic etching of the silicon nitride film.

9. A method of fabrication of semiconductor devices according to claim 6, wherein wet etching employing hot phosphoric acid solution is carried out for the isotropic etching of the silicon nitride film.

10. A method of fabrication of semiconductor devices according to claim 1, wherein reactive ion etching employing Cl2/SF6/He as the etching gas is carried out for the etching of the polysilicon film in step (f).

11. A method of fabrication of semiconductor devices according to claim 2, wherein reactive ion etching employing Cl2/SF6/He as the etching gas is carried out for the etching of the polysilicon film in step (f).

12. A method of fabrication of semiconductor devices according to claim 3, wherein reactive ion etching employing Cl2/SF6/He as the etching gas is carried out for the etching of the polysilicon film in step (f).

13. A method of fabrication of semiconductor devices according to claim 4, wherein reactive ion etching employing Cl2/SF6/He as the etching gas is carried out for the etching of the polysilicon film in step (f).

14. A method of fabrication of semiconductor devices according to claim 5, wherein reactive ion etching employing Cl2/SF6/He as the etching gas is carried out for the etching of the polysilicon film in step (f).

15. A method of fabrication of semiconductor devices according to claim 6, wherein reactive ion etching employing Cl2/SF6/He as the etching gas is carried out for the etching of the polysilicon film in step (f).

16. A method of fabrication of semiconductor devices according to claim 7, wherein reactive ion etching employing Cl2/SF6/He as the etching gas is carried out for the etching of the polysilicon film in step (f).

17. A method of fabrication of semiconductor devices according to claim 8, wherein reactive ion etching employing Cl2/SF6/He as the etching gas is carried out for the etching of the polysilicon film in step (f).

18. A method of fabrication of semiconductor devices according to claim 9, wherein reactive ion etching employing Cl2/SF6/He as the etching gas is carried out for the etching of the polysilicon film in step (f).

* * * * *